United States Patent
Henzler et al.

(10) Patent No.: US 11,411,559 B2
(45) Date of Patent: Aug. 9, 2022

(54) MULTI-VOLTAGE DOMAIN ACTUATOR SIGNAL NETWORK

(71) Applicant: Intel Corporation, Santa Clara, CA (US)

(72) Inventors: Stephan Henzler, Munich (DE); Nikhil Subhas Konaraddi, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/052,737

(22) PCT Filed: Aug. 6, 2018

(86) PCT No.: PCT/US2018/045340
§ 371 (c)(1),
(2) Date: Nov. 3, 2020

(87) PCT Pub. No.: WO2020/032915
PCT Pub. Date: Feb. 13, 2020

(65) Prior Publication Data
US 2021/0234542 A1 Jul. 29, 2021

(51) Int. Cl.
*H03K 19/0175* (2006.01)
*G06F 1/10* (2006.01)
*H03K 17/687* (2006.01)

(52) U.S. Cl.
CPC ....... *H03K 19/017509* (2013.01); *G06F 1/10* (2013.01); *H03K 17/6872* (2013.01); *H03K 17/6874* (2013.01)

(58) Field of Classification Search
CPC ....... H03K 19/017509; H03K 17/6872; H03K 17/6874; H03K 5/15; H03K 5/1504; G06F 1/10
See application file for complete search history.

(56) References Cited

U.S. PATENT DOCUMENTS

| 5,900,752 A | 5/1999 | Mar |
| 6,255,884 B1 | 7/2001 | Lewyn |
| 8,174,288 B2 * | 5/2012 | Dennard ........ H03K 19/018521 326/81 |
| 2006/0279348 A1 * | 12/2006 | Woo .......................... G06F 1/06 327/333 |

OTHER PUBLICATIONS

European Patent Office, PCT International Search Report issued for PCT/US2018/045340, 5 pgs., dated Apr. 15, 2019.

* cited by examiner

*Primary Examiner* — Metasebia T Retebo
(74) *Attorney, Agent, or Firm* — Banner & Witcoff Ltd.

(57) ABSTRACT

Networks, methods, and circuitries are provided that propagate an actuator signal to a plurality of devices in a respective plurality of voltage domains. The network includes a first signal path disposed between an actuator signal source and a first device. The first signal path includes a first point at which the actuator signal is in a first voltage domain. A second signal path is disposed between the actuator signal source and a second device. The second signal path includes a second point at which the actuator signal is in a second voltage domain. The first voltage domain is different from, and has a fixed relationship to, the second voltage domain. A multi-domain coupling circuitry is connected to the first point and the second point. The multi-domain coupling circuitry is configured to maintain the fixed relationship between the actuator signal at the first point and the second point.

15 Claims, 7 Drawing Sheets

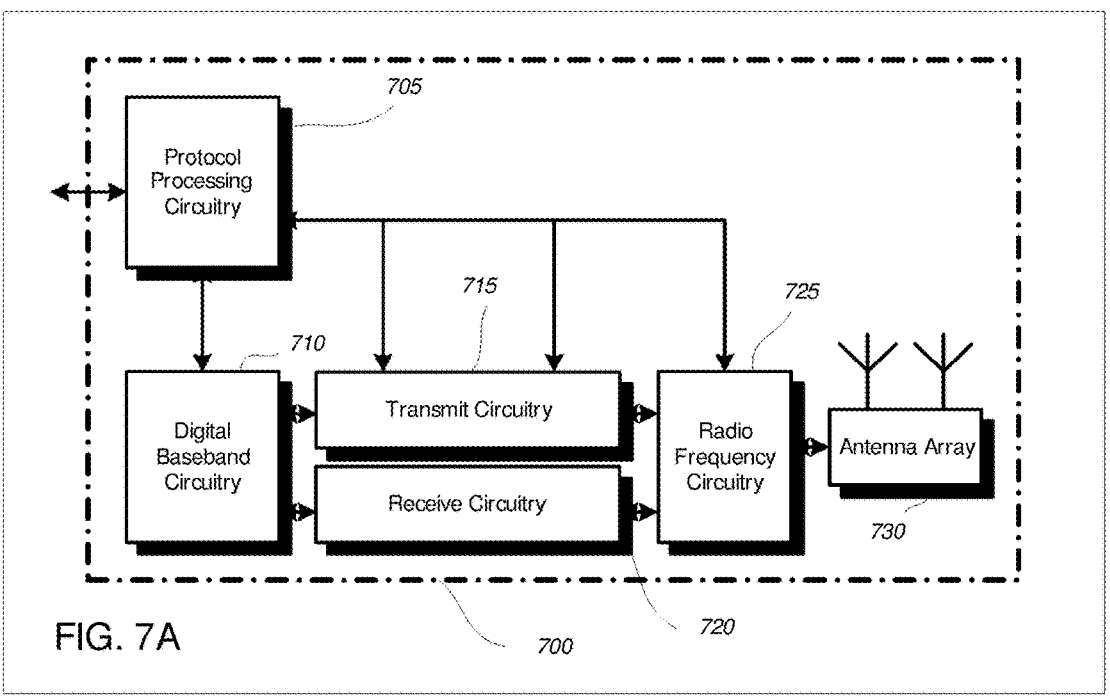
FIG. 7A
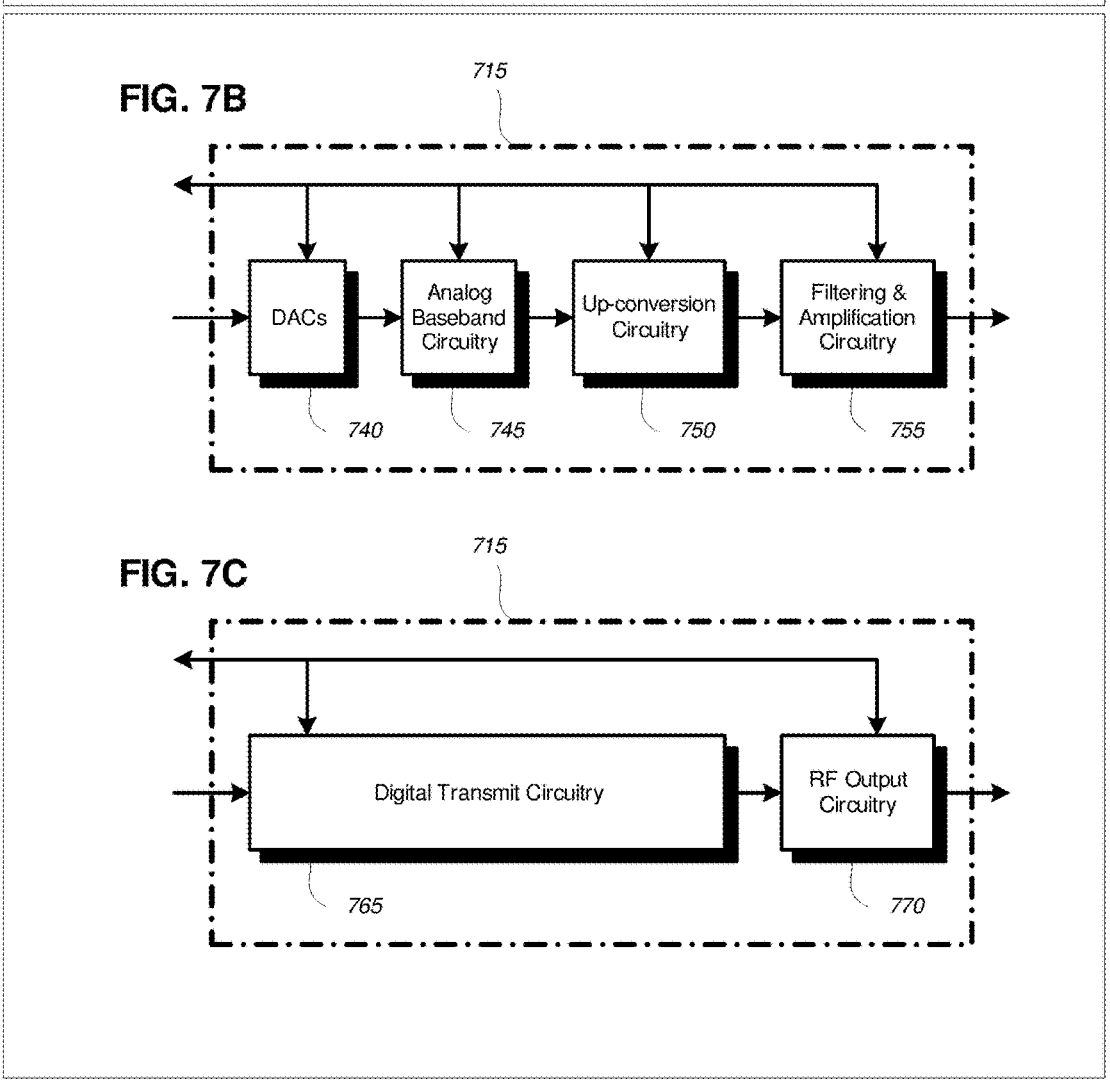
FIG. 7B
FIG. 7C

MULTI-VOLTAGE DOMAIN ACTUATOR SIGNAL NETWORK

BACKGROUND

Some devices include electronic components, such as switches, that function in different voltage domains. A voltage domain is a range of voltages in which the upper voltage corresponds to a first logical value (e.g., a logical 1 or 0) and the lower voltage corresponds to the other logical value (e.g., a logical 0 or 1). Thus, the same voltage may be interpreted to have a different logical meaning by devices in different voltage domains. To synchronize the operation of components in different voltage domains, a common timing signal may be propagated and "level shifted" along multiple circuit branches to supply the timing signal to components in the appropriate voltage domain.

BRIEF DESCRIPTION OF THE DRAWINGS

FIGS. 7A-7C illustrate examples for an exemplary communication circuitry in accordance with various aspects described.

DESCRIPTION

Complex electronic devices often include devices or components that operate in different voltage domains. For the purposes of this description, a voltage domain is a range of voltages between an upper voltage and a lower voltage. The upper voltage value is interpreted as either a logical 1 or 0 and the lower voltage value is interpreted as the opposite logical value.

In an actuator signal network, any pair of voltage domains share a fixed relationship with respect to one another, meaning that at any given time, the voltage in one voltage domain can be determined solely based on the voltage in the other voltage domain. One example of this fixed relationship is an offset. When two voltage domains have an offset relationship, it means that the lower voltage in one domain differs from the lower voltage in the other domain by a certain differential and the upper voltage in the one domain differs from the upper voltage in the other domain by the same differential. A first voltage domain between 3 and 6 volts has an offset relationship to a second voltage domain between 2 and 5 volts with a differential of 1V.

Another example of a fixed relationship is a scaled relationship in which the range of voltages spanned in one domain is not equal to the range of voltages spanned by the other domain. A first voltage domain between 3 and 6 volts has a scaled relationship with respect to a second voltage domain between 4 and 6 volts. In some scaled relationships, the first and second voltage domain have a common lower voltage or upper voltage, while in other scaled relationships, the first and second voltage domains do not have an upper voltage or lower voltage in common.

Figure 1:
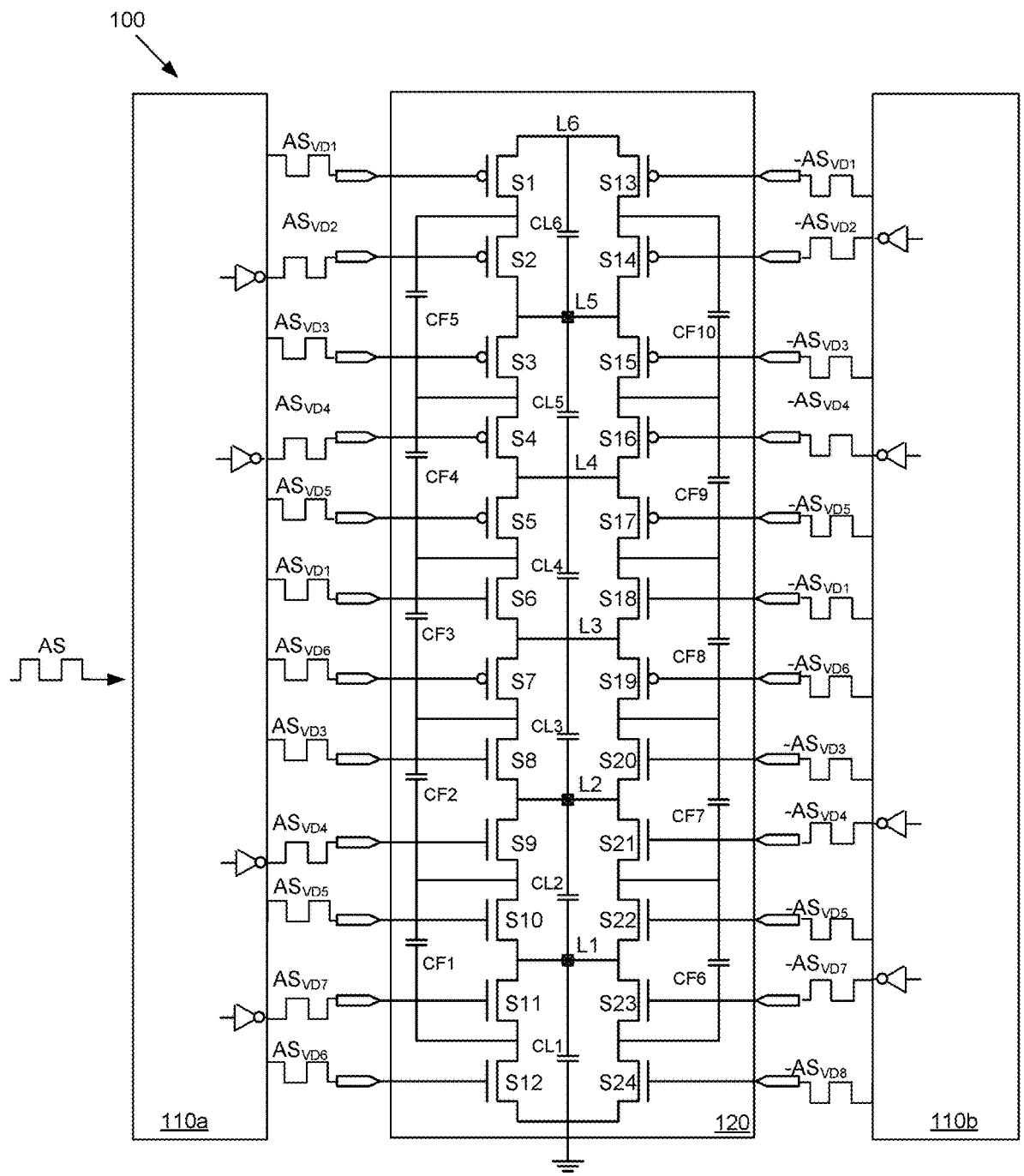
FIG. 1 illustrates an exemplary charge pump that receives actuator signals from a signal network in accordance with various aspects described.

FIG. 1 illustrates a charge pump system 100 that includes a ladder type charge pump 120 and a signal network 110a, 110b that supplies an actuator signal AS to switching devices in the ladder charge pump. The charge pump 120 includes six ladder capacitors CL1-CL6 which are kept at a desired charge level by switching devices S1-S24 selectively connecting the ladder capacitors to a network of flying capacitors CF1-CF10. One example application for the charge pump 120 is in a digital envelope tracker associated with a power amplifier in a transmitter. The voltages generated by the charge pump can be selectively switched to the power supply input of the power amplifier based on the instantaneous power requirement of the power amplifier.

The switching devices associated with each ladder capacitor are used to alternately connect the ladder capacitor between two flying capacitor network configurations. Due to the different levels of charges on the various capacitors in the charge pump, the switching devices each operate in one of seven different voltage domains. The charge pump 120 is arranged in two symmetric halves so that each switching device has a corresponding switching device in the other half (e.g., S1 and S13) that is in the same voltage domain. All of the switching devices are controlled by the actuator signal in their respective voltage domain. In each pair of switching devices, one of the switching devices is controlled by the actuator signal while the other switching device is controlled by the actuator signal shifted 180 degrees in phase (e.g., $AS_{VD1}$ and $-AS_{VD1}$ for S1 and S13, respectively).

The actuator signals in the different voltage domains are generated by the signal network 110a, 110b (shown in two parts to simplify the illustration). The signal network receives the actuator signal AS in some source voltage domain and propagates the actuator signal amongst various level shifting branches to provide the actuator signal in the appropriate voltage domain to each of the switching devices S1-S24 in the charge pump. For optimal charge pump performance, the actuator signal in the different voltage domains should be synchronized so that all of the switching devices switch simultaneously. If the actuator signal in the different voltage domains is not synchronized the charge pump may experience "shoot through" in the switching devices that belong to non-overlapping pairs. For the purposes of this description, the term "actuator signal" is meant to include a clock signal, a switch control signal, or any other signal that is propagated into multiple voltage domains while maintaining timing alignment of the signal within the voltage domains.

Figure 2:
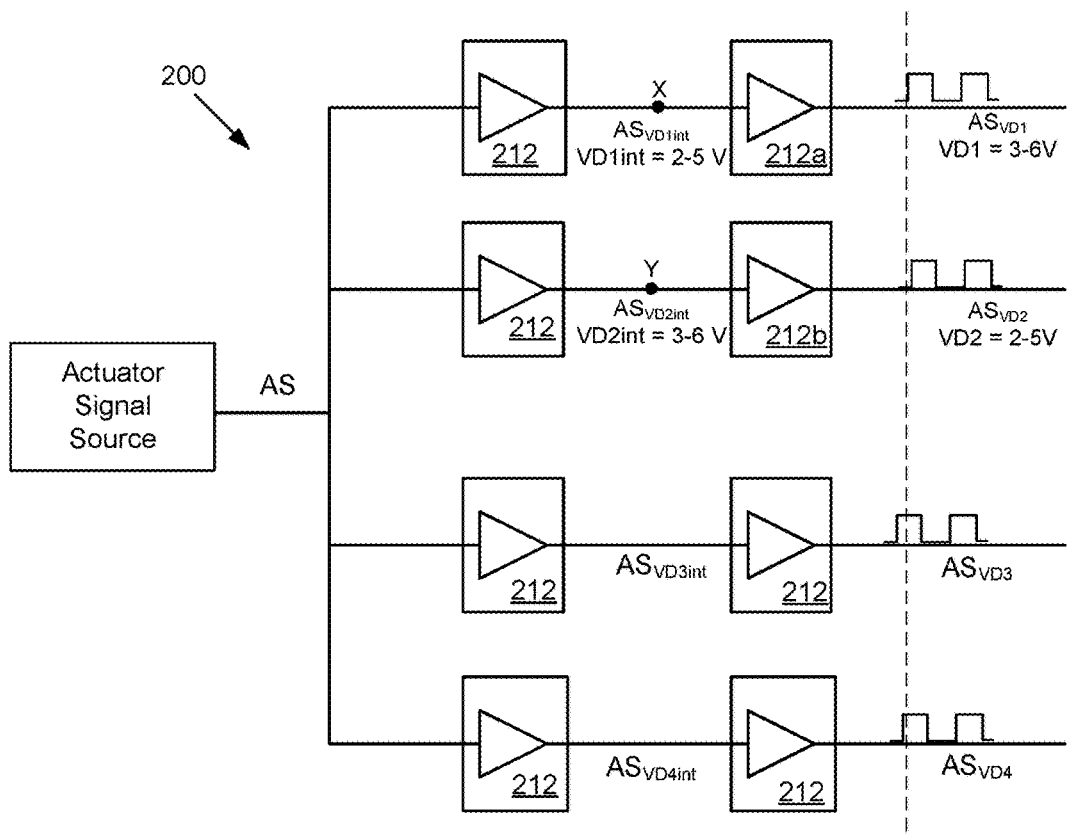
FIG. 2 illustrates an exemplary signal network.

Referring now to FIG. 2, a conventional signal network 200 is illustrated that includes four signal branches that split at an actuator signal source (which may be a phase locked loop or other clock circuitry). The signal network 200 propagates the actuator signal AS through the four branches to provide four actuator signals in four different voltage domains $AS_{VD1}$-$AS_{VD4}$ to four actuator devices (not shown, e.g. switching devices). Along each signal branch level shifter circuitries 212 incrementally shift the voltage domain of the actuator signal to the desired voltage domain. The level shifters circuitries 212 are active circuitry that add or drain power from the actuator signal. Each level shifter circuitry 212 receives AS in a "received" voltage domain and shifts the AS to a different voltage domain. For simplicity, level shifter circuitry will be referred to in the shorthand notation of "level shifter" in some instances, however, level shifter is intended to mean circuitry configured to provide the level shifting function. The level shifting from the source voltage domain to the respective target voltage domain can be done in one, two, or multiple steps. The number of steps can differ along different branches.

By way of example, in FIG. 2, the first voltage domain is between 3 and 6 volts while the second voltage domain is between 2 and 5 volts. At point Y in the second signal path, the actuator signal has been shifted by a first level shifter to an intermediate voltage domain between 3 and 6 volts. A second level shifter 212b receives the actuator signal in the intermediate voltage domain $AS_{VD2int}$ and shifts the actuator signal to the desired voltage domain $AS_{VD2}$ of between 2 and 5 volts in which 2V is interpreted as a logical 0 and 5V is interpreted as a logical 1.

Figures 2A, 2B:
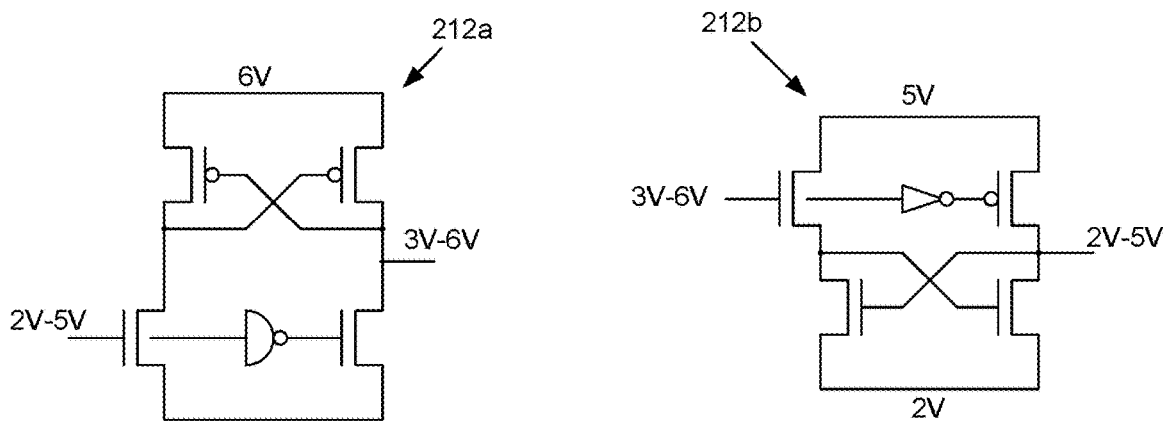
FIGS. 2A and 2B illustrate exemplary level shifter circuitry.

FIG. 2A illustrates one example of level shifter circuitry 212a that shifts an actuator signal in a voltage domain between 2 and 5 volts "up" to a voltage domain between 3 and 6 volts. Based on the input, one of the input NMOS transistors is ON and the other OFF. The active device pulls its drain node down to its source potential which is 3V in this example. This low voltage is seen by the cross coupled PMOS transistors of the opposite branch. The PMOS with the low gate potential turns on and pulls its drain node up to the upper supply voltage (6V in this case). The corresponding PMOS in the first branch turns off and allows for a low voltage level at its drain node.

In one signal path the actuator signal may be shifted up into a first intermediate voltage domain in a first level-shifting step and down into a second voltage domain in a second level shifting step.

FIG. 2B illustrates one example of level shifter circuitry 212b that shifts an actuator signal in a voltage domain between 3 and 6 volts "down" to a voltage domain between 2 and 5 volts. Based on the input, one of the input transistors is ON and the other OFF. This effect is seen by the cross coupled transistors that actively drives the output low or high in the respective voltage domains Returning to FIG. 2, it can be seen that the actuator signal propagates along a completely independent signal path in the different voltage domains. These independent signal paths suffer from variations that translate into differences in propagation delays. Systemic delay differences may also arise because of different voltage levels and the fact that the different voltage levels may require different types of level shifter circuitry. Thus, the actuator signals in the four different voltage domains are not aligned, as shown schematically in FIG. 2. To compensate for the delay differences, an actuator signal may be adapted to include a very conservative non-overlap time, which slows system performance. Further, the resulting tri-state phase leads to increased noise levels at the output of the signal network.

Described herein are signal networks, circuitries, and methods that propagate an actuator signal into different voltage domains having a fixed relationship with respect to one another with reduced delay differences between the actuator signal in the different voltage domains. The disclosed signal networks, circuitries, and methods connect multi-domain coupling circuitry between signal paths in a signal network to reduce skew in the actuator signals on the signal paths. The multi-domain coupling circuitry is configured to maintain the fixed relationship between the actuator signal in the first signal path and the actuator signal in the second signal path. In one example, the signal network also includes signal branches with overlap to reduce delay differences due to independent signal paths.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

Figure 3:
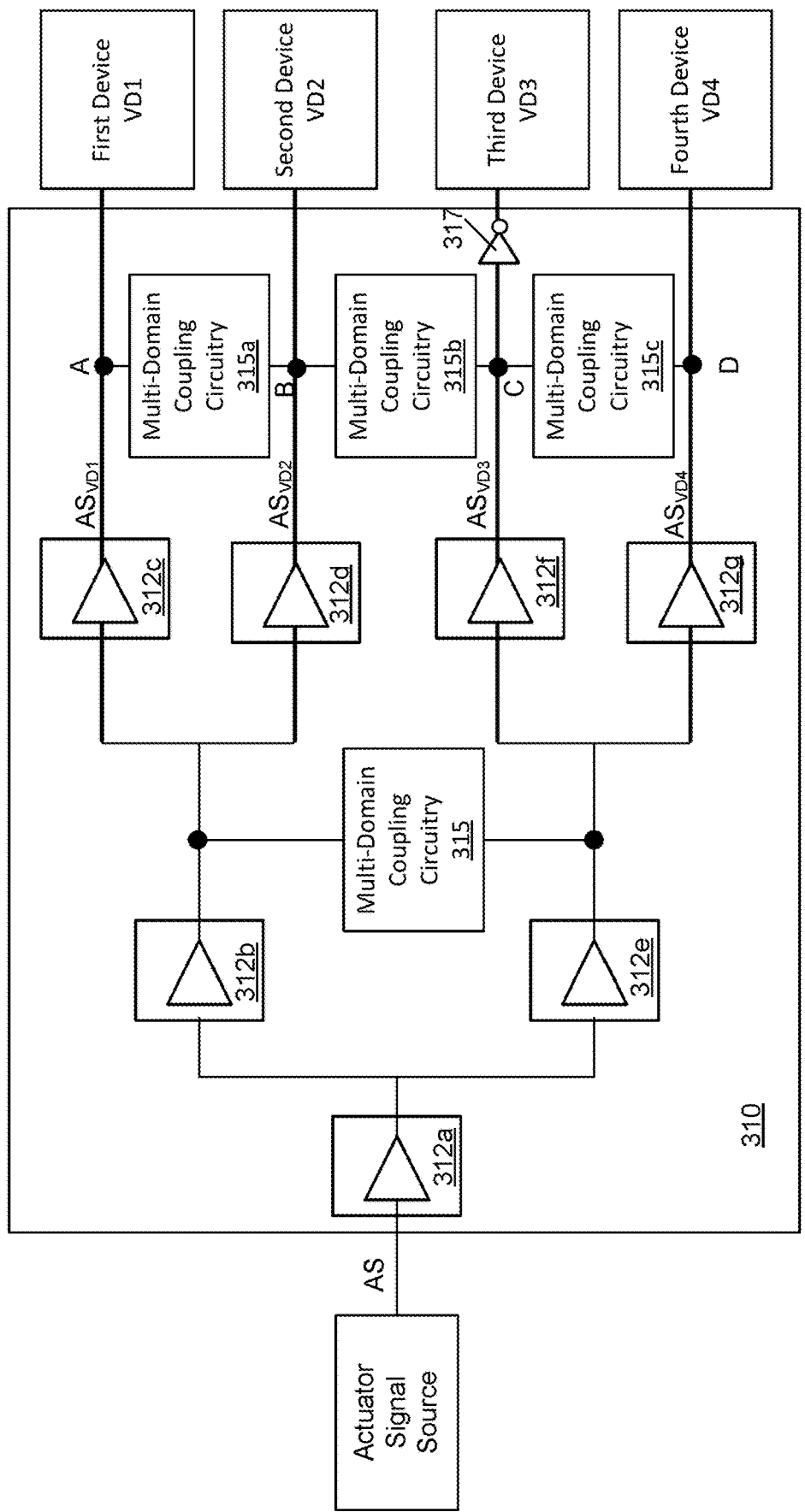
FIG. 3 illustrates an exemplary signal network that includes multi-domain coupling circuitry between signal paths in accordance with various aspects described.

FIG. 3 illustrates an exemplary signal network 310 in which signal paths are connected to one another with multi-domain coupling circuitry 315 to reduce delay differences between actuator signals in different voltage domains. The signal network 310 includes four signal paths, each connecting an actuator signal source to a different device (e.g., such as switching devices S1-S24 in FIG. 1). A first signal path includes level shifters 312a, 312b, and 312c. The first signal path propagates and level shifts the actuator signal AS in an source voltage domain (e.g., a baseband domain) to a first voltage domain VD1 in which a first device operates. Each of the level shifters receives the actuator signal in a given voltage domain and shifts the received actuator signal to a different voltage domain. Example level shifter circuitry is illustrated in FIGS. 2A and 2B. Of course, any level shifter circuitry may be used. A second signal path includes level shifters 312a, 312b, and 312d. The second signal path propagates and level shifts the actuator signal AS in the source voltage domain to a second voltage domain VD2 in which a second device operates.

To reduce delay differences, multi-domain coupling circuitry 315 is connected between signal paths or branches of the network 310. The multi-domain coupling circuitry 315 is configured to maintain the fixed relationship between the actuator signal in the signal paths between which the multi-domain coupling circuitry is connected. By way of example, the coupling circuitry 315a is connected between the first signal path at point A and the second signal path at point B. At point A in the first signal path the actuator signal is in the first voltage domain, having been level shifted by the level shifters 312a, 312b, and 312c. At point B in the second signal path the actuator signal is in the second voltage domain, having been level shifted by the level shifters 312a, 312b, and 312d. Recall that any pair of voltage domains in the signal network 310 have a fixed (e.g., offset or scaled) relationship with respect to one another. Thus, the actuator signal in the first voltage domain has a fixed relationship with respect to the actuator signal in the second voltage domain.

The multi-domain coupling circuitry 315a is configured to maintain the fixed relationship between the actuator signal at point A and the actuator signal at point B. For example, if the first voltage domain and the second voltage domain have an offset relationship in which the first voltage domain is higher than the second voltage domain by a differential of 1 V, the multi-domain coupling circuitry 315a will maintain a difference of 1V as between point A and point B. Thus, multi-domain coupling circuitry 315b is adapted to maintain the particular fixed relationship between voltage domain VD2 and voltage domain VD3 and multi-domain coupling circuitry 315c is adapted to maintain the particular fixed relationship between voltage domain VD3 and voltage domain VD4. The multi-domain coupling circuitry 315a is different from a simple short or direct connection between points A and B because the voltage on either side of the device is maintained by the device to be different voltages as opposed to being driven to the same voltage.

The multi-domain coupling circuitry 315a will raise the voltage on one of the signal paths if the voltage on that path is below the voltage specified by the fixed relationship or lower the voltage on one of the signal paths if the voltage on that path is above the voltage specified by the fixed relationship. In this manner if the actuator signal on the first signal path is lagging the actuator signal on the second signal path, the multi-domain coupling circuitry 315a will raise the voltage on the second signal path and/or lower the voltage on the first signal path until the fixed relationship is met to better synchronize the actuator signals in the first and second voltage domains.

Put another way, the multi-domain coupling circuitry 315 aligns the actuator signal switching time between the two instances of the actuator signal to which the multi-domain coupling circuitry 315 is connected. The multi-domain coupling circuitry 315 accelerates the actuator signal in the second signal path if the actuator signal in the second signal path lags the signal in the first signal path. The multi-domain coupling circuitry 315 decelerates the signal in the second signal path if the actuator signal in the second signal path leads the actuator signal at the first point.

It can be seen in FIG. 3 that multi-domain coupling circuitry 315 may be coupled between any two points in the signal network including points at which the actuator signal is in intermediate voltage domains (e.g., the multi-domain coupling circuitry 315 connecting the first two branches of the network). Because all of the voltage domains have a fixed relationship with one another, the particular instance of multi-domain coupling circuitry 315 connected between two signal paths is adapted and configured to maintain the particular fixed relationship between the voltage domains on either side of the multi-domain coupling circuitry 315.

Another beneficial aspect to the signal network 310 is the branching configuration of the signal paths. As compared to the signal network of FIG. 2 in which four completely independent paths are used to propagate and level shift actuator signals to the four voltage domains, the signal network 310 has a tree-like structure in which level shifters are shared by multiple signal paths, meaning that the signal paths overlap to reduce delay differences between the actuator signals in the various voltage domains. In the signal network 310, level shifter 312a is common level shifter circuitry to all four signal paths in the network. Likewise level shifter 310b is common level shifter circuitry with respect to the first and second signal paths. Level shifter 310b receives the actuator signal voltage in a common voltage domain (with respect to the all four signal paths) and shifts the actuator signal to a common intermediate voltage domain which is common to the first and second signal paths.

In FIG. 3 an inverter 317 is disposed at the output of the third signal path of the network 310 (see also invertors in network 110a, 110b of FIG. 1). Other "output" circuitries may be disposed in the output of some or all of the signal paths of the network 310 including a non-overlap circuit for the two switch devices in each stage of a ladder type charge pump, a strong buffer, and so on.

Figure 4:
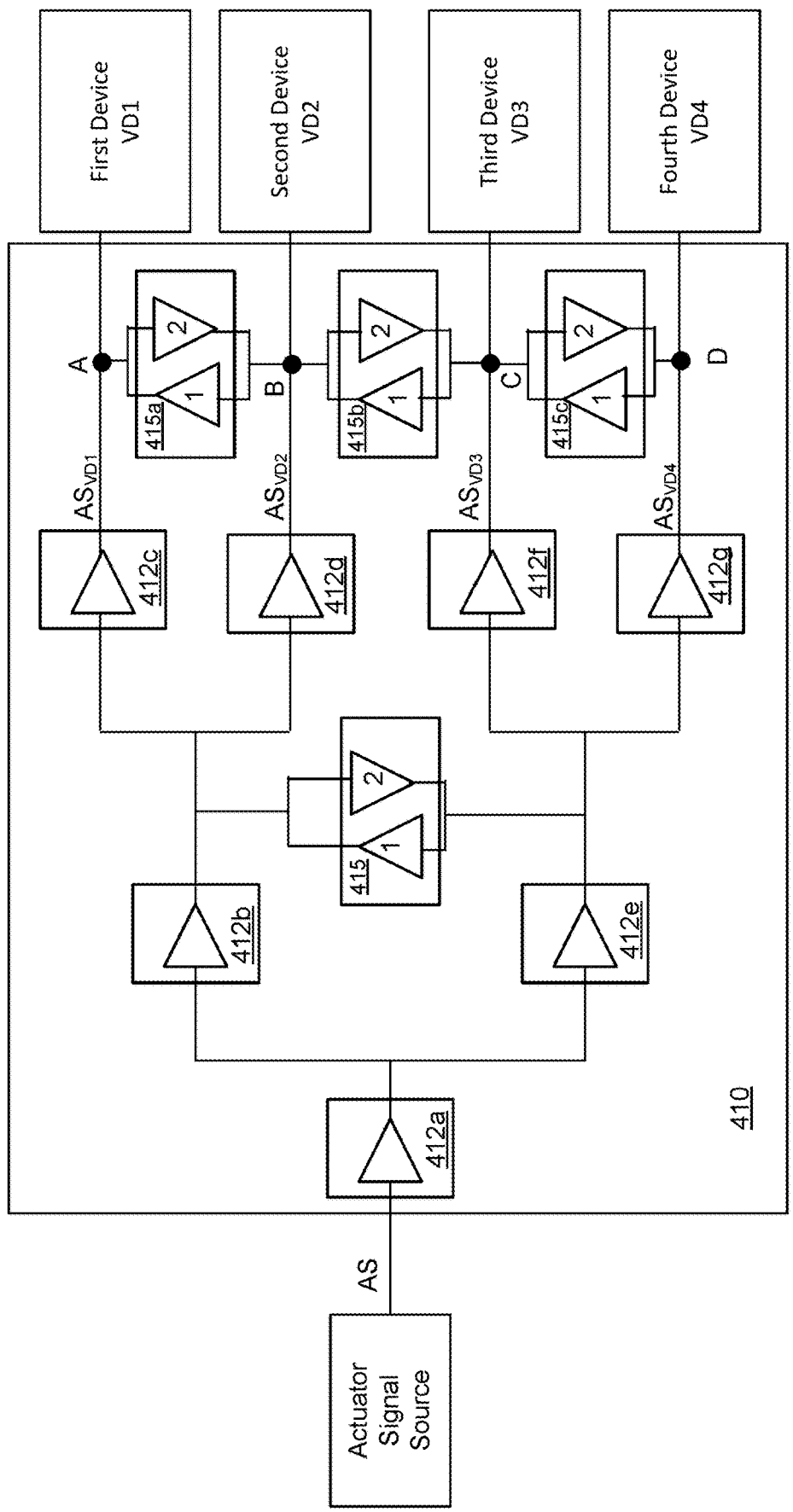
FIG. 4 illustrates another exemplary signal network that includes multi-domain coupling circuitry between signal paths in accordance with various aspects described.

FIG. 4 illustrates an exemplary signal network 410 that includes multi-domain coupling circuitry 415 connected between signal paths. Each multi-domain coupling circuitry 415 includes a first coupling level shifter 1 and a second coupling level shifter 2. The first coupling level shifter is adapted and configured to shift the voltage domain on a first of the signal paths to the voltage domain on the other signal path. The second coupling level shifter is configured to shift the voltage domain on the other signal path to the voltage domain on the first of the signal paths.

For example, if the first voltage domain VD1 is 3 to 6 V and the second voltage domain VD2 is 2 to 5 V, the first coupling level shifter 1 in multi-domain coupling circuitry 415a is adapted and configured to shift the second voltage domain 2 to 5 V to the first voltage domain 3 to 6 V. In one example, the coupling level shifter 1 is embodied by the circuitry 212a of FIG. 2A. The second coupling level shifter 2 in multi-domain coupling circuitry 415a is adapted and configured to shift the first voltage domain 3 to 6 V to the first voltage domain 2 to 5 V. In one example, the coupling level shifter 2 is embodied by the circuitry 212b of FIG. 2B. The other multi-domain coupling circuitries 415b, 415c function in a similar manner with respect to the second and third voltage domains and the third and fourth voltage domains, respectively.

It can be seen that the first coupling level shifter of the multi-domain coupling circuitry 415 accelerates the actuator signal on the first signal path if the signal lags the actuator signal on the second signal path. Likewise, the second coupling level shifter of the multi-domain coupling circuitry 415 accelerates the actuator signal on the second signal path if the signal lags the actuator signal on the first signal path.

Figure 5:
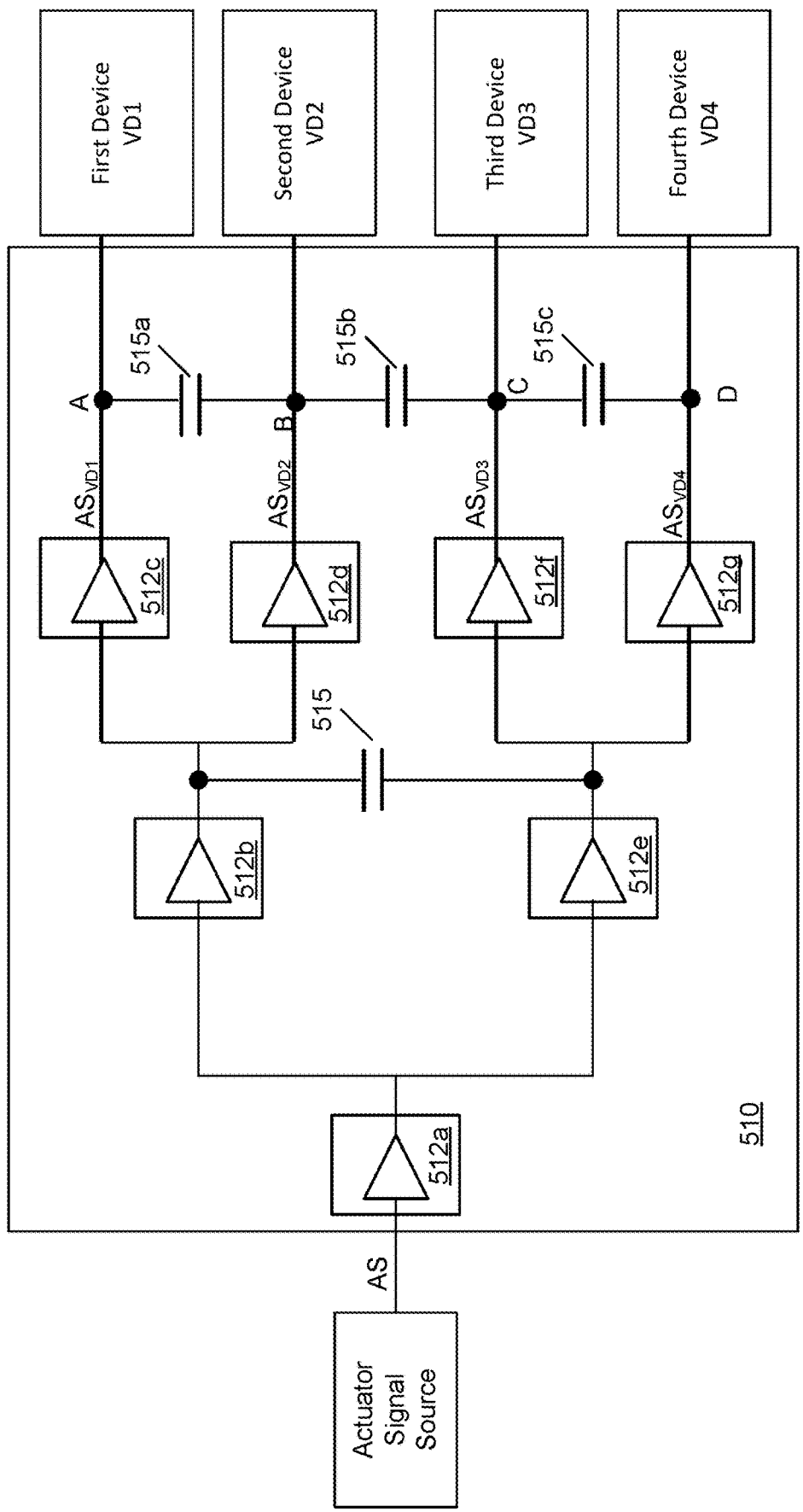
FIG. 5 illustrates an exemplary signal network that includes multi-domain circuitry coupling between signal paths in accordance with various aspects described.

FIG. 5 illustrates a signal network 510 that includes multi-domain coupling circuitry 515 connected between signal paths. Each multi-domain coupling circuitry 515 includes a capacitor configured to store a charge equivalent to a voltage differential between the voltage domains connected at each of its terminals. For example if the first voltage domain VD1 is 3 to 6 V and the second voltage domain VD2 is 2 to 5 V, the capacitor 515a is configured to store energy corresponding to 1 V with its positive terminal connected at point A and its negative terminal connected at point B. While the example shown in FIG. 5 has the benefit of being passive (i.e., not consuming power), the capacitor based multi-domain coupling circuitry 515 works between voltage domains having an offset relationship but not between voltage domains having a scaled relationship.

Figure 6:
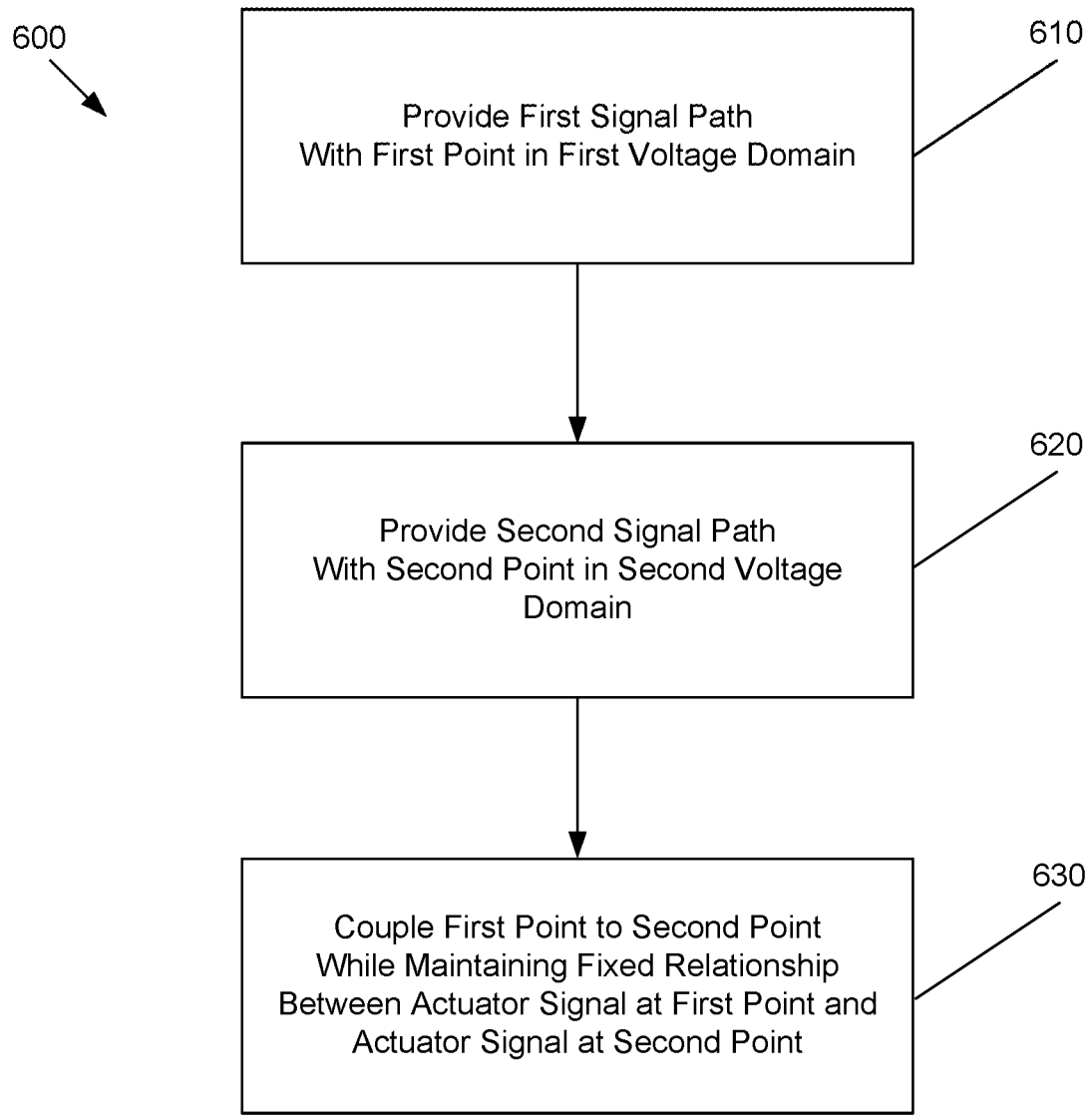
FIG. 6 illustrates an exemplary flow diagram of an exemplary method of generating actuator signals for devices in different voltage domains in accordance with various aspects described.

FIG. 6 illustrates a flow diagram outlining an exemplary method 600 for propagating an actuator signal in different voltage domains in a manner that aligns the switching time of the actuator signals in the different voltage domains. The method 600 may be performed by the signal networks 310, 410, and/or 510 of FIGS. 3, 4, and 5, respectively. The method includes, at 610, providing a first signal path disposed between an actuator signal source and a first device. The first signal path includes a first point at which the actuator signal is in a first voltage domain corresponding to a first range of voltages between a first upper voltage and a first lower voltage. At 620, the method includes providing a second signal path disposed between the actuator signal source and a second device. The second signal path includes a second point at which the actuator signal is in a second voltage domain corresponding to a second range of voltages between a second upper voltage and a second lower voltage. The first range of voltages is different from, and has a fixed relationship to, the second range of voltages. At 630, the method includes coupling the first point to the second point while maintaining the fixed relationship between an actuator signal at the first point and an actuator signal at the second point.

FIG. 7A illustrates an exemplary millimeter wave communication circuitry 700 which may embody transceivers that include the charge pump of FIG. 1 and actuator signal networks of FIGS. 3-5 according to some aspects. Circuitry 700 is alternatively grouped according to functions. Components as shown in 700 are shown here for illustrative purposes and may include other components not shown here in FIG. 7A.

Millimeter wave communication circuitry 700 may include protocol processing circuitry 705, which may implement one or more of medium access control (MAC), radio link control (RLC), packet data convergence protocol (PDCP), radio resource control (RRC) and non-access stratum (NAS) functions. Protocol processing circuitry 705 may include one or more processing cores (not shown) to execute instructions and one or more memory structures (not shown) to store program and data information.

Millimeter wave communication circuitry 700 may further include digital baseband circuitry 710, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 700 may further include transmit circuitry 715, receive circuitry 720 and/or antenna array circuitry 730.

Millimeter wave communication circuitry 700 may further include radio frequency (RF) circuitry 725. In an aspect of the invention, RF circuitry 725 may include multiple parallel RF chains for one or more of transmit or receive functions, each connected to one or more antennas of the antenna array 730.

In an aspect of the disclosure, protocol processing circuitry 705 may include one or more instances of control circuitry (not shown) to provide control functions for one or more of digital baseband circuitry 710, transmit circuitry 715, receive circuitry 720, and/or radio frequency circuitry 725.

FIGS. 7B and 7C illustrate examples for transmit circuitry 715 in FIG. 7A in some aspects.

The exemplary transmit circuitry 715 of FIG. 7B may include one or more of digital to analog converters (DACs) 740, analog baseband circuitry 745, up-conversion circuitry 750 and filtering and amplification circuitry 755. In another aspect, 7C illustrates an exemplary transmit circuitry 715 which includes digital transmit circuitry 765 and output circuitry 770.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for extending the range of an ADC according to embodiments and examples described herein.

Example 1 is a signal network configured to propagate an actuator signal to a plurality of devices in a respective plurality of voltage domains. The network includes a first signal path and a second signal path. The first signal path is disposed between an actuator signal source and a first device. The first signal path includes a first point at which the actuator signal is in a first voltage domain corresponding to a first range of voltages between a first upper voltage and a first lower voltage. The second signal path is disposed between the actuator signal source and a second device. The second signal path includes a second point at which the actuator signal is in a second voltage domain corresponding to a second range of voltages between a second upper voltage and a second lower voltage. The first range of voltages is different from, and has a fixed relationship to, the second range of voltages. A multi-domain coupling circuitry is connected to the first point and the second point. The multi-domain coupling circuitry is configured to maintain the fixed relationship between the actuator signal at the first point and the actuator signal at the second point.

Example 2 includes the subject matter of example 1, including or omitting any optional elements, wherein the multi-domain coupling circuitry includes a capacitor configured to store a voltage substantially equivalent to a difference between the first upper voltage and the second upper voltage.

Example 3 includes the subject matter of example 1, including or omitting any optional elements, wherein the multi-domain coupling circuitry includes a level shifter circuitry that is configured to receive the actuator signal in a received voltage domain and shift the actuator signal to a different voltage domain.

Example 4 includes the subject matter of example 3, including or omitting any optional elements, wherein the multi-domain coupling circuitry includes: a first coupling level shifter circuitry configured to receive the actuator signal in the first voltage domain and shift the actuator signal to the second voltage domain; and a second coupling level shifter circuitry configured to receive the actuator signal in the second voltage domain and shift the actuator signal to the first voltage domain.

Example 5 includes the subject matter of example 1, including or omitting any optional elements, further including: a common level shifter circuitry disposed in the first signal path and the second signal path, wherein the common level shifter circuitry is configured to receive the actuator signal in a common voltage domain and shift the actuator signal to a common intermediate voltage domain; a first level shifter circuitry disposed in the first signal path, wherein the first level shifter circuitry is configured to receive the actuator signal in the common intermediate voltage domain and shift the actuator signal to a first intermediate voltage domain; and a second level shifter circuitry disposed in the second signal path, wherein the second level shifter circuitry is configured to receive the actuator signal in the common intermediate voltage domain and shift the actuator signal to a second intermediate voltage domain.

Example 6 includes the subject matter of example 1, including or omitting any optional elements, further including an output circuitry disposed in the first signal path between the first point and the first device.

Example 7 includes the subject matter of example 1, including or omitting any optional elements, wherein the first upper voltage is different from the second upper voltage or the first lower voltage is different than the second lower voltage.

Example 8 includes the subject matter of example 1, including or omitting any optional elements, wherein the first upper voltage is different from the second upper voltage and the first lower voltage is different than the second lower voltage.

Example 9 is a method, including: providing a first signal path disposed between an actuator signal source and a first device, wherein the first signal path includes a first point, further wherein at the first point the actuator signal is in a first voltage domain corresponding to a first range of voltages between a first upper voltage and a first lower voltage; providing a second signal path disposed between the actuator signal source and a second device, wherein the second signal path includes a second point, further wherein at the second point the actuator signal is in a second voltage domain corresponding to a second range of voltages between a second upper voltage and a second lower voltage, wherein the first range of voltages is different from, and has a fixed relationship to, the second range of voltages; and coupling the first point to the second point while maintaining the fixed relationship between the actuator signal at the first point and the actuator signal at the second point.

Example 10 includes the subject matter of example 9, including or omitting any optional elements, including coupling a capacitor between the first point and the second point, wherein the capacitor is configured to store a voltage substantially equivalent to a difference between the first upper voltage and the second upper voltage.

Example 11 includes the subject matter of example 9, including or omitting any optional elements, including coupling a level shifter circuitry between the first point and the second point, wherein the level shifter circuitry is configured to receive the actuator signal in a received voltage domain and shift the actuator signal to a different voltage domain.

Example 10 includes the subject matter of example 11, including or omitting any optional elements, including: coupling a first coupling level shifter circuitry between the first point and the second point, wherein the first coupling level shifter circuitry is configured to receive the actuator signal in the first voltage domain and shift the actuator signal to the second voltage domain; and coupling a second coupling level shifter circuitry between the second point and the first point, wherein the second coupling level shifter circuitry is configured to receive the actuator signal in the second voltage domain and shift the actuator signal to the first voltage domain.

Example 13 includes the subject matter of example 9, including or omitting any optional elements, further including: disposing a common level shifter circuitry in the first signal path and the second signal path, wherein the common level shifter circuitry is configured to receive the actuator signal in a common voltage domain and shift the actuator signal to a common intermediate voltage domain; disposing a first level shifter circuitry in the first signal path, wherein the first level shifter circuitry is configured to receive the actuator signal in the common intermediate voltage domain and shift the actuator signal to a first intermediate voltage domain; and disposing a second level shifter circuitry in the second signal path, wherein the second level shifter circuitry is configured to receive the actuator signal in the common intermediate voltage domain and shift the actuator signal to a second intermediate voltage domain.

Example 14 includes the subject matter of example 9, including or omitting any optional elements, wherein the actuator signal at the first point and the signal at the second point include clock signals for synchronously controlling operation of a first device and a second device, respectively.

Example 15 includes the subject matter of example 9, including or omitting any optional elements, wherein the first upper voltage is different from the second upper voltage or the first lower voltage is different than the second lower voltage.

Example 16 includes the subject matter of example 9, including or omitting any optional elements, wherein the first upper voltage is different from the second upper voltage and the first lower voltage is different than the second lower voltage.

Example 17 is a signal network configured to propagate an actuator signal to a plurality of devices in a respective plurality of voltage domains. The network includes a first signal path and a second signal path. The first signal path is disposed between an actuator signal source and a first device. The first signal path includes a first point at which the actuator signal is in a first voltage domain corresponding to a first range of voltages between a first upper voltage and a first lower voltage. The second signal path is disposed between the actuator signal source and a second device. The second signal path includes a second point at which the actuator signal is in a second voltage domain corresponding to a second range of voltages between a second upper voltage and a second lower voltage. The first range of voltages is different from, and has a fixed relationship to, the second range of voltages. A multi-domain coupling circuitry is connected to the first point and the second point, wherein the multi-domain coupling circuitry is configured to align a switching time of the actuator signal at the first point with the switching time of the actuator signal at the second point.

Example 18 includes the subject matter of example 17, including or omitting any optional elements, wherein the multi-domain coupling circuitry includes a capacitor configured to store a voltage substantially equivalent to a difference between the first upper voltage and the second upper voltage.

Example 19 includes the subject matter of example 17, including or omitting any optional elements, wherein the multi-domain coupling circuitry includes: a first coupling level shifter circuitry configured to receive the actuator signal in the first voltage domain and shift the actuator signal to the second voltage domain; and a second coupling level shifter circuitry configured to receive the actuator signal in the second voltage domain and shift the actuator signal to the first voltage domain.

Example 20 includes the subject matter of example 17, including or omitting any optional elements, further including: a common level shifter circuitry disposed in the first signal path and the second signal path, wherein the common level shifter circuitry is configured to receive the actuator signal in a common voltage domain and shift the actuator signal to a common intermediate voltage domain; a first level shifter circuitry disposed in the first signal path, wherein the first level shifter circuitry is configured to receive the actuator signal in the common intermediate voltage domain and shift the actuator signal to a first intermediate voltage domain; and a second level shifter circuitry disposed in the second signal path, wherein the second level shifter circuitry is configured to receive the actuator signal in the common intermediate voltage domain and shift the actuator signal to a second intermediate voltage domain.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A signal network configured to provide an actuator signal to a plurality of devices in a respective plurality of voltage domains, the network comprising:
   a first signal path between an actuator signal source and a first device, wherein the first signal path comprises a first point, further wherein at the first point the actuator signal is in a first voltage domain corresponding to a first range of voltages between a first upper voltage and a first lower voltage;

a second signal path between the actuator signal source and a second device, wherein the second signal path comprises a second point, further wherein at the second point the actuator signal is in a second voltage domain corresponding to a second range of voltages between a second upper voltage and a second lower voltage, wherein the first range of voltages has a fixed relationship to the second range of voltages; and a multi-domain coupling circuitry comprising a level shifter circuitry connected between the first point and the second point, wherein the multi-domain coupling circuitry is configured to maintain the fixed relationship between the actuator signal at the first point and the actuator signal at the second point, and is configured to receive the actuator signal in a received voltage domain and shift the actuator signal to a different voltage domain.

2. The signal network of claim 1, wherein the multi-domain coupling circuitry comprises:

a first coupling level shifter circuitry configured to receive the actuator signal in the first voltage domain and shift the actuator signal to the second voltage domain; and a second coupling level shifter circuitry configured to receive the actuator signal in the second voltage domain and shift the actuator signal to the first voltage domain.

3. The signal network of claim 1, further comprising:

a common level shifter circuitry disposed in the first signal path and the second signal path, wherein the common level shifter circuitry is configured to receive the actuator signal in a common voltage domain and shift the actuator signal to a common intermediate voltage domain;

a first level shifter circuitry disposed in the first signal path, wherein the first level shifter circuitry is configured to receive the actuator signal in the common intermediate voltage domain and shift the actuator signal to a first intermediate voltage domain; and a second level shifter circuitry disposed in the second signal path, wherein the second level shifter circuitry is configured to receive the actuator signal in the common intermediate voltage domain and shift the actuator signal to a second intermediate voltage domain.

4. The signal network of claim 1, further comprising an output circuitry disposed in the first signal path between the first point and the first device.

5. The signal network of claim 1, wherein the first upper voltage is different from the second upper voltage or the first lower voltage is different than the second lower voltage.

6. The signal network of claim 1, wherein the first upper voltage is different from the second upper voltage and the first lower voltage is different than the second lower voltage.

7. A method, comprising providing a first signal path between an actuator signal source and a first device, wherein the first signal path comprises a first point, further wherein at the first point the actuator signal is in a first voltage domain corresponding to a first range of voltages between a first upper voltage and a first lower voltage;

providing a second signal path between the actuator signal source and a second device, wherein the second signal path comprises a second point, further wherein at the second point the actuator signal is in a second voltage domain corresponding to a second range of voltages between a second upper voltage and a second lower voltage, wherein the first range of voltages has a fixed relationship to the second range of voltages; and coupling a level shifter circuitry between the first point and the second point while maintaining the fixed relationship between the actuator signal at the first point and the actuator signal at the second point, wherein the level shifter circuitry is configured to receive the actuator signal in a received voltage domain and shift the actuator signal to a different voltage domain.

8. The method of claim 7, comprising:

coupling a first coupling level shifter circuitry between the first point and the second point, wherein the first coupling level shifter circuitry is configured to receive the actuator signal in the first voltage domain and shift the actuator signal to the second voltage domain; and coupling a second coupling level shifter circuitry between the second point and the first point, wherein the second coupling level shifter circuitry is configured to receive the actuator signal in the second voltage domain and shift the actuator signal to the first voltage domain.

9. The method of claim 7, further comprising:

disposing a common level shifter circuitry in the first signal path and the second signal path, wherein the common level shifter circuitry is configured to receive the actuator signal in a common voltage domain and shift the actuator signal to a common intermediate voltage domain;

disposing a first level shifter circuitry in the first signal path, wherein the first level shifter circuitry is configured to receive the actuator signal in the common intermediate voltage domain and shift the actuator signal to a first intermediate voltage domain; and disposing a second level shifter circuitry in the second signal path, wherein the second level shifter circuitry is configured to receive the actuator signal in the common intermediate voltage domain and shift the actuator signal to a second intermediate voltage domain.

10. The method of claim 7, wherein the actuator signal at the first point and the signal at the second point comprise clock signals for synchronously controlling operation of a first device and a second device, respectively.

11. The method of claim 7, wherein the first upper voltage is different from the second upper voltage or the first lower voltage is different than the second lower voltage.

12. The method of claim 7, wherein the first upper voltage is different from the second upper voltage and the first lower voltage is different than the second lower voltage.

13. A signal network configured to provide an actuator signal to a plurality of devices in a respective plurality of voltage domains, the network comprising:

a first signal path between an actuator signal source and a first device, wherein the first signal path comprises a first point, further wherein at the first point the actuator signal is in a first voltage domain corresponding to a first range of voltages between a first upper voltage and a first lower voltage;

a second signal path between the actuator signal source and a second device, wherein the second signal path comprises a second point, further wherein at the second point the actuator signal is in a second voltage domain corresponding to a second range of voltages between a second upper voltage and a second lower voltage, wherein the first range of voltages has a fixed relationship to the second range of voltages; and a multi-domain coupling circuitry comprising a level shifter circuitry connected between the first point and the second point, and configured to receive the actuator signal in a received voltage domain and shift the actuator signal to a different voltage domain, wherein the multi-domain coupling circuitry is configured to align a switching time of the actuator signal at the first point with the switching time of the actuator signal at the second point.

14. The signal network of claim 13, wherein the multi-domain coupling circuitry comprises:
a first coupling level shifter circuitry configured to receive the actuator signal in the first voltage domain and shift the actuator signal to the second voltage domain; and
a second coupling level shifter circuitry configured to receive the actuator signal in the second voltage domain and shift the actuator signal to the first voltage domain.

15. The signal network of claim 13, further comprising:
a common level shifter circuitry disposed in the first signal path and the second signal path, wherein the common level shifter circuitry is configured to receive the actuator signal in a common voltage domain and shift the actuator signal to a common intermediate voltage domain;
a first level shifter circuitry disposed in the first signal path, wherein the first level shifter circuitry is configured to receive the actuator signal in the common intermediate voltage domain and shift the actuator signal to a first intermediate voltage domain; and
a second level shifter circuitry disposed in the second signal path, wherein the second level shifter circuitry is configured to receive the actuator signal in the common intermediate voltage domain and shift the actuator signal to a second intermediate voltage domain.

* * * * *